United States Patent
Gao et al.

(10) Patent No.: US 11,955,975 B2
(45) Date of Patent: Apr. 9, 2024

(54) ROUTING INTEGRATED CIRCUIT ELEMENT

(71) Applicant: LeRain Technology Co., Ltd., New Taipei (TW)

(72) Inventors: Miaobin Gao, New Taipei (TW); Chia-Chi Hu, New Taipei (TW)

(73) Assignee: LERAIN TECHNOLOGY CO., LTD., New Taipei (TW)

( * ) Notice: Subject to any disclaimer, the term of this patent is extended or adjusted under 35 U.S.C. 154(b) by 348 days.

(21) Appl. No.: 17/553,981

(22) Filed: Dec. 17, 2021

(65) Prior Publication Data

US 2022/0311427 A1    Sep. 29, 2022

Related U.S. Application Data

(60) Provisional application No. 63/164,782, filed on Mar. 23, 2021.

(30) Foreign Application Priority Data

Apr. 13, 2021   (TW) .................. 110113261

(51) Int. Cl.
*H03K 5/02*     (2006.01)
*H01L 23/49*    (2006.01)
*H04Q 11/04*    (2006.01)

(52) U.S. Cl.
CPC .............. *H03K 5/02* (2013.01); *H01L 23/49* (2013.01); *H04Q 11/0471* (2013.01)

(58) Field of Classification Search
CPC ................ H01L 23/49; H01L 24/14; H01L 2224/14515; H01L 2224/14134;
(Continued)

(56) References Cited

U.S. PATENT DOCUMENTS 6,714,051 B2    3/2004  Takiba et al.
7,145,704 B1 *  12/2006 Islam .................. H04J 14/0212
                                                    359/344

(Continued)

FOREIGN PATENT DOCUMENTS

CN          1442954 A       9/2003
CN          1916963 A       2/2007
(Continued)

*Primary Examiner* — Jung Liu
(74) *Attorney, Agent, or Firm* — MUNCY, GEISSLER, OLDS & LOWE, P.C.

(57) ABSTRACT

A routing integrated circuit element is disclosed. The routing integrated circuit element is connected between a first and a second electronic module and includes a body, a first, and a second buffer element. A first side of the body is connected to the first electronic module. A second side is connected to the second electronic module and located on a different side from the first side. The distance between the second side and the second electronic module is shorter than the distance between the second side and the first electronic module. The first buffer element transmits an electronic signal from the first side to the second side. The second buffer element transmits the electronic signal from the second side to the first side, wherein the transmission directions of the electronic signals transmitted by the first buffer element and the second buffer element are opposite.

11 Claims, 6 Drawing Sheets

(58) Field of Classification Search
CPC . H01L 2224/16225; H01L 24/16; H03K 5/02; H04Q 11/0471; H04Q 2213/13322; H04W 40/00
See application file for complete search history.

(56) References Cited

U.S. PATENT DOCUMENTS

| | | | |
|---|---|---|---|
| 7,340,557 B2 | 3/2008 | Kong et al. | |
| 7,460,742 B2* | 12/2008 | Joyner | G02B 6/12007 385/24 |
| 7,477,807 B2* | 1/2009 | Welch | B82Y 20/00 398/91 |
| 7,792,396 B2* | 9/2010 | Kish, Jr. | G02B 6/12023 385/14 |
| 8,300,994 B2* | 10/2012 | Welch | G02B 6/12004 385/14 |
| 9,235,542 B2 | 1/2016 | Liu et al. | |
| 9,531,495 B2* | 12/2016 | Chiaroni | H04J 14/021 |
| 9,667,374 B2* | 5/2017 | Boduch | H04B 10/07957 |
| 10,003,399 B2* | 6/2018 | Chang | H04J 14/005 |
| 11,258,507 B2* | 2/2022 | Buer | H04B 7/18517 |
| 11,695,470 B2* | 7/2023 | Buer | H04B 7/18513 370/325 |
| 11,843,448 B2* | 12/2023 | Buer | H01Q 21/24 |
| 2005/0025409 A1* | 2/2005 | Welch | G02B 6/136 385/14 |
| 2008/0252588 A1 | 10/2008 | Huang | |
| 2015/0288442 A1* | 10/2015 | Chang | H04B 7/18517 370/316 |
| 2016/0269140 A1* | 9/2016 | Boduch | H04B 10/07955 |
| 2020/0304201 A1* | 9/2020 | Buer | H01Q 21/0025 |

FOREIGN PATENT DOCUMENTS

| | | |
|---|---|---|
| CN | 101107643 A | 1/2008 |
| CN | 103684305 A | 3/2014 |
| CN | 103972735 A | 8/2014 |

\* cited by examiner

ROUTING INTEGRATED CIRCUIT ELEMENT

BACKGROUND OF THE INVENTION

1. Field of the Invention

The present invention relates to a routing integrated circuit element; more particularly, the present invention relates to a routing integrated circuit element internally having different signal transmission directions.

2. Description of the Related Art

With the progress of technology, the transmission speed of data communication is increasing. Both communication equipment and data server equipment must be capable of high-speed data transmission. Conventionally, a transmission speed of 32 Gb/s can be achieved by means of PCIe Gen5, and a transmission speed of 64 Gb/s can be achieved by means of PCIe Gen6. However, in such a high-speed transmission environment, the electromagnetic field is a major factor in the quality of the data transmission. As a result, the direction of the signal routing becomes the key factor in data transmission quality.

Please refer to FIG. 1, which illustrates a schematic drawing of a conventional routing integrated circuit element according to a prior art.

In the prior art, the routing integrated circuit element 90 is connected between a first electronic module 81 and a second electronic module 82 so as to perform bidirectional transmission of signals between the first electronic module 81 and the second electronic module 82. As an example for explanation, the routing integrated circuit element 90 shown in FIG. 1 has a first buffer element 91 and a second buffer element 92. The first buffer element 91 and the second buffer element 92 represent that the routing integrated circuit element 90 has signal transmission channels in two directions. Therefore, the first buffer element 91 receives a signal inputted from a first input port 911 and then connects to a first output port 912 to output the signal, and the second buffer element 92 receives a signal inputted from a second input port 921 and then connects to a second output port 922 to output the signal. As shown in FIG. 1, the signal of the first electronic module 81 is directly transmitted to the first input port 911 closer to the first electronic module 81 and then passes through the first buffer element 91 and the first output port 912 to be outputted to the second electronic module 82.

However, with respect to the second electronic module 82, the signal of the second electronic module 82 has to be transmitted to the second input port 921 farther away from the second electronic module 82 and then pass through the second buffer element 92 to be outputted to the first electronic module 81 via the second output port 922. As a result, the signal transmission distance, the total signal loss, the number of circuit board vias, and the complexity of the circuit layout will all increase, thereby resulting in crosstalk and signal quality degradation.

Therefore, there is a need to provide a novel routing integrated circuit element to mitigate and/or obviate the aforementioned problems.

SUMMARY OF THE INVENTION

It is an object of the present invention to provide a routing integrated circuit element internally having different signal transmission directions.

To achieve the abovementioned object, the routing integrated circuit element of the present invention is connected between at least a first electronic module and a second electronic module so as to transmit an electronic signal. The routing integrated circuit element comprises a body, a first buffer element and a second buffer element. The body has a first side and a second side. The first side is connected to the first electronic module. The second side is connected to the second electronic module and is located on a different side from the first side. The distance between the second side and the second electronic module is shorter than the distance between the second side and the first electronic module. The first buffer element is disposed in the body and is used for transmitting the electronic signal from the first side to the second side. The second buffer element is disposed in the body and is used for transmitting the electronic signal from the second side to the first side. A transmission direction of the electronic signal transmitted by the first buffer element and a transmission direction of the electronic signal transmitted by the second buffer element are opposite. As a result, the electronic signal can be smoothly transmitted between the first electronic module and the second electronic module.

Other objects, advantages, and novel features of the invention will become more apparent from the following detailed description when taken in conjunction with the accompanying drawings.

BRIEF DESCRIPTION OF THE DRAWINGS

All of the objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
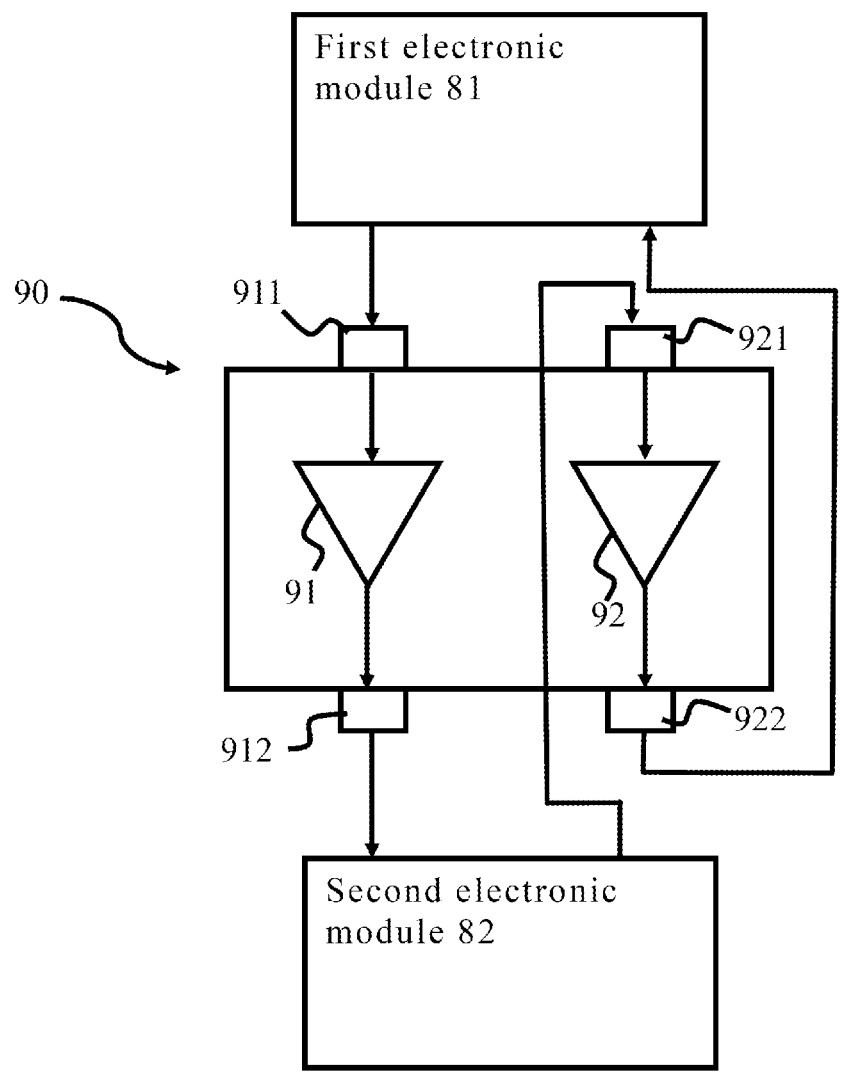
FIG. 1 illustrates a schematic drawing of a conventional routing integrated circuit element according to a prior art.
Figure 2:
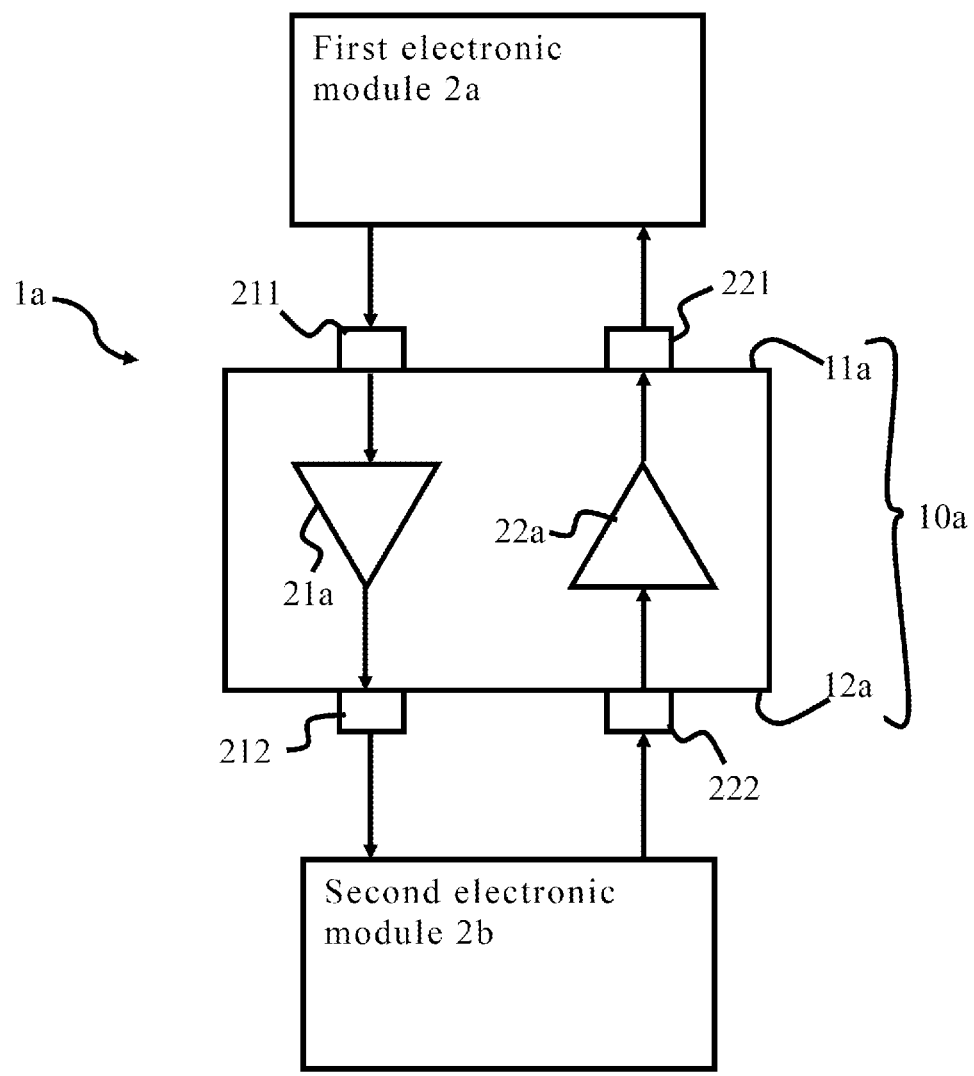
FIG. 2 illustrates a structural schematic drawing of a routing integrated circuit element according to a first embodiment of the present invention.

Please refer to FIG. 2, which illustrates a structural schematic drawing of a routing integrated circuit element according to a first embodiment of the present invention.

In the first embodiment of the present invention, the routing integrated circuit element 1a is connected between at least a first electronic module 2a and a second electronic module 2b so as to perform bidirectional transmission of electronic signals. The electronic signal can be transmitted by, for example but not limited to, a signal-end signal, a differential signal, or a single signal line as shown in the schematic drawing in FIG. 2. Please note that the terms "first" and "second" are used merely for describing elements of the present invention without limiting the scope of the elements. These terms are used only for differentiating one element from another. For example, without departing from the scope of the various embodiments of the present invention, the first buffer element can be referred to as the second buffer element, and similarly, the second buffer element can be called the first buffer element. The first buffer element and the second buffer element are both buffer elements and are not the same buffer element.

The routing integrated circuit element 1a can be disposed on a printed circuit board such as a motherboard, which can then be installed in a computer host, a smart phone, a tablet PC or other wearable devices. The first electronic module 2a and the second electronic module 2b can be central processing units, graphics processing units, display screens, storage devices, or any other modules capable of performing signal transmission with other modules. Please note that the scope of the modules is not limited to the abovementioned examples. In the first embodiment, the routing integrated circuit element 1a comprises a body 10a, a first buffer element 21a and a second buffer element 22a. For example, the body 10a can have a single-crystal silicon wafer as its base layer; techniques such as photolithography, doping and chemical-mechanical polishing (CMP) can be used to manufacture elements such as the first buffer element 21a and the second buffer element 22a; and techniques such as thin film and CMP can be used to manufacture conducting wires so as to complete the manufacturing of the routing integrated circuit element 1a. Because the production flow of manufacturing the integrated circuit element is not the main technical feature of the present invention, there is no need to further describe its principles.

The body 10a of the routing integrated circuit element 1a is in the shape of a quadrangle; therefore, it has a first side 11a and a second side 12. The second side 12a and the first side 11a are located on different sides of the body 10a. In the first embodiment of the present invention, the second side 12a and the first side 11a are respectively located on opposite sides of the body 10a. The first side 11a is located closer to and is connected to the first electronic module 2a, and the second side 12a is located closer to and is connected to the second electronic module 2b. As a result, the distance between the second side 12a and the second electronic module 2b is shorter than the distance between the second side 12a and the first electronic module 2a. The first buffer element 21a and the second buffer element 22a are both disposed in the body 10a. The first buffer element 21a is used for transmitting the electronic signal from the first side 11a to the second side 12a. The second buffer element 22a is used for transmitting the electronic signal from the second side 12a to the first side 11a. The first buffer element 21a and the second buffer element 22a are, without limiting the scope of the present invention, amplifiers or attenuators, or multiplexers or de-multiplexers. The electronic signal of the first electronic module 2a can be transmitted to the second electronic module 2b via a first input port 211, the first buffer element 21a and a first output port 212. The electronic signal of the second electronic module 2b can be transmitted to the first electronic module 2a via a second input port 222, the second buffer element 22a and a second output port 221. Because the direction in which the first buffer element 21a transmits the electronic signal is opposite to the direction in which the second buffer element 22a transmits the electronic signal, the routing integrated circuit element 1a can be configured according to the locations of the first electronic module 2a and the second electronic module 2b so as to shorten the transmission path of the electronic signal. Therefore, the electronic signal can be smoothly transmitted between the first electronic module 2a and the second electronic module 2b.

Figure 3:
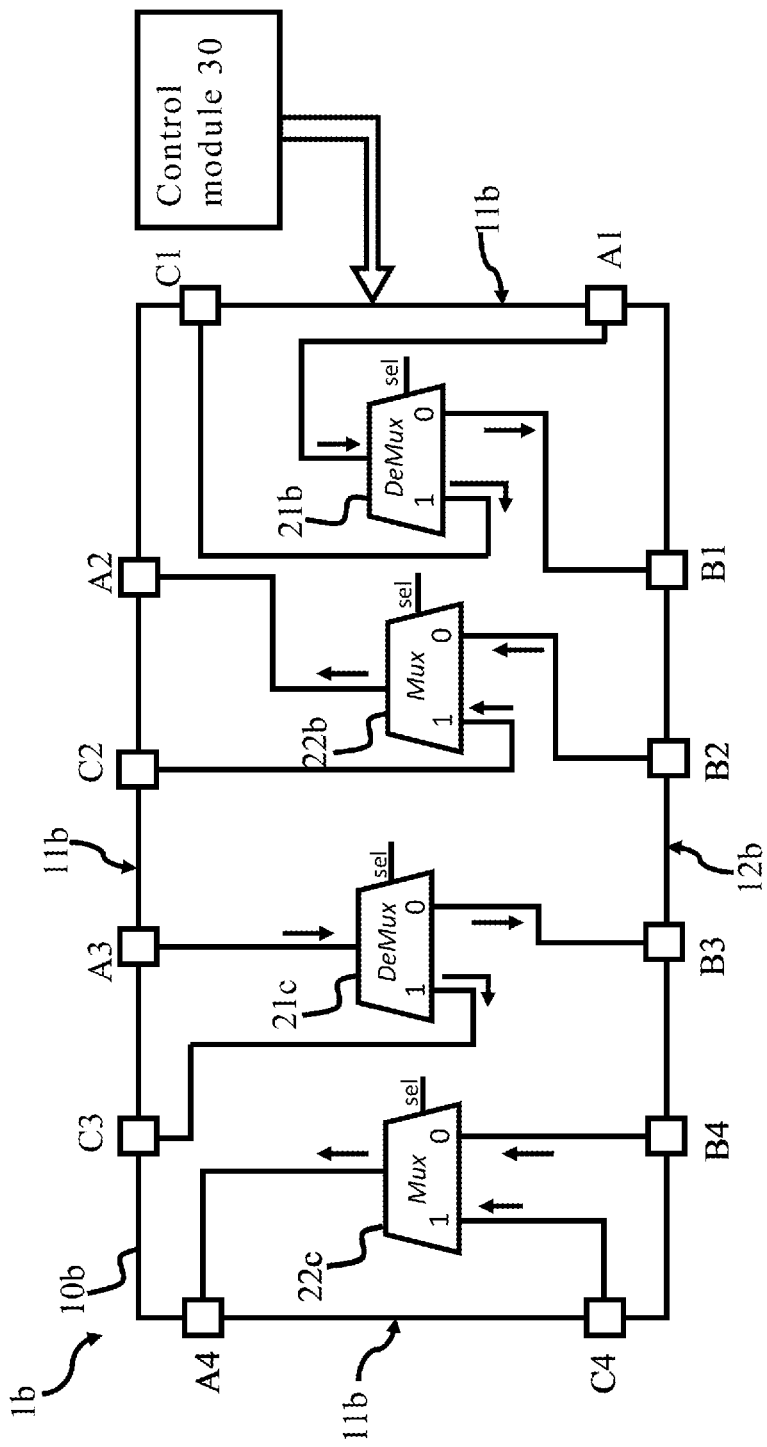
FIG. 3 illustrates a structural schematic drawing of the routing integrated circuit element according to a second embodiment of the present invention.

Next, please refer to FIG. 3, which illustrates a structural schematic drawing of the routing integrated circuit element according to a second embodiment of the present invention.

Figure 5A:
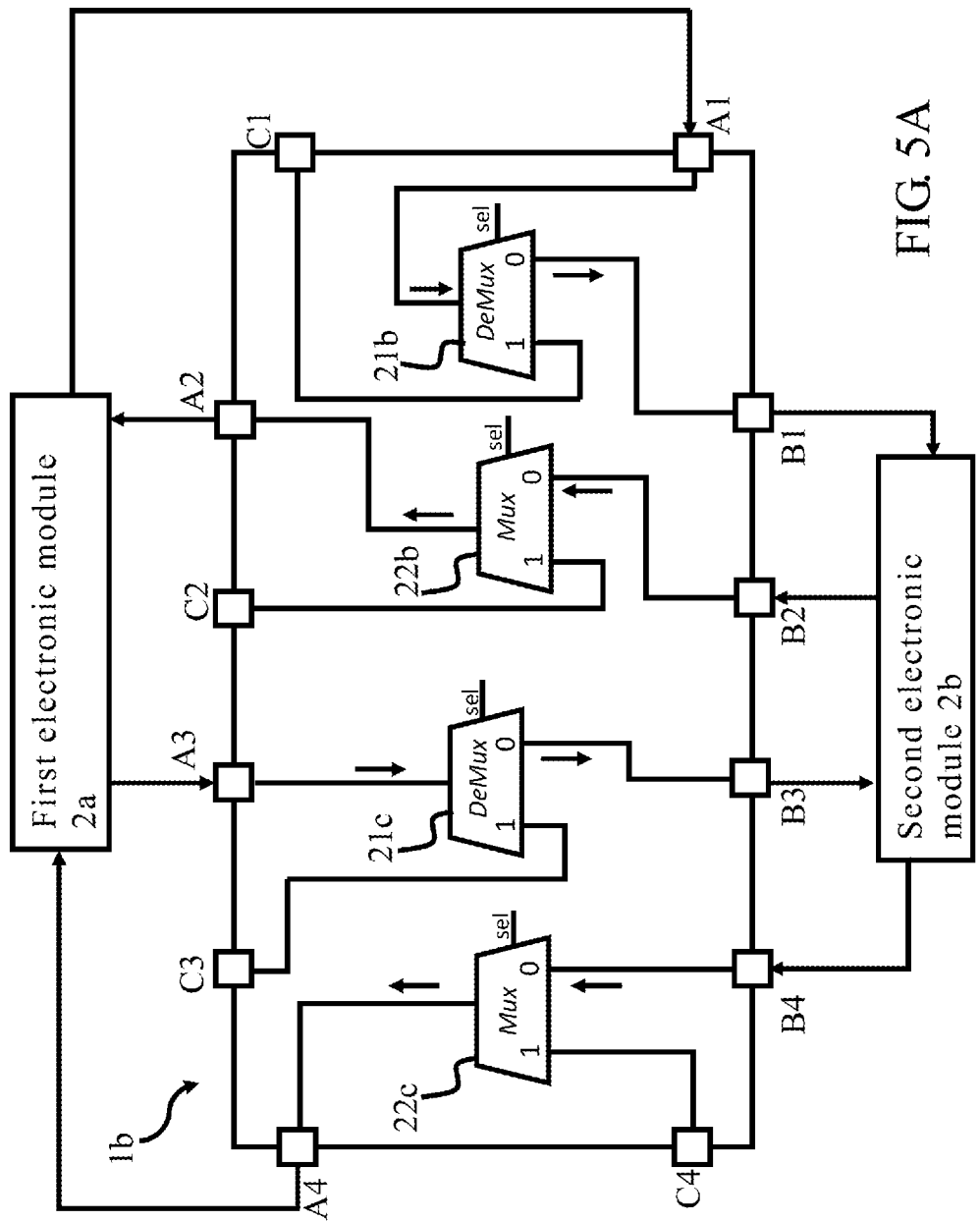
FIG. 5A illustrates a schematic drawing showing a transmission path of the routing integrated circuit element according to the second embodiment of the present invention.
Figure 5B:
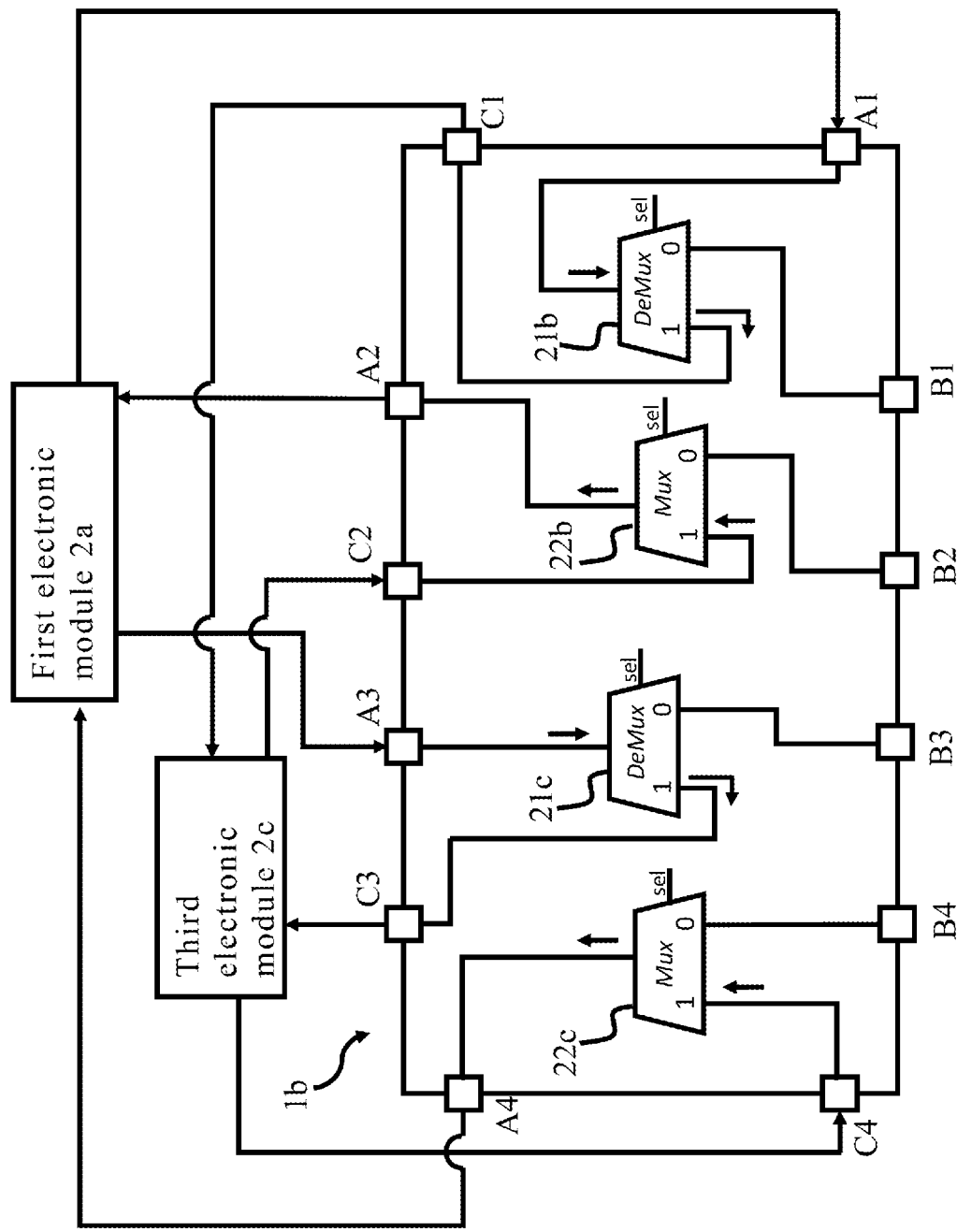
FIG. 5B illustrates a schematic drawing showing a second transmission path of the routing integrated circuit element according to the second embodiment of the present invention.

In the second embodiment of the present invention, the routing integrated circuit element 1b comprises a body 10b, two sets of first buffer elements 21b and 21c, and two sets of second buffer elements 22b and 22c, and the routing integrated circuit element 1b is connected to a first electronic module 2a, a second electronic module 2b, and a third electronic module 2c (as shown in FIGS. 5A-5B). The body 10b is also in the shape of a quadrangle. The edge of the body 10b has a first side 11b located farther away from the second electronic module 2b and a second side 12b located closer to the second electronic module 2b. According to the aforementioned definition, the second side 12b and the first side 11b are respectively located on opposite sides or adjacent sides of the body 10b. In the second embodiment of the present invention, the first buffer elements 21b and 21c are de-multiplexers, and the second buffer elements 22b and 22c are multiplexers, so that such configuration is applicable for three electronic modules. The first buffer elements 21b and 21c have input ports A1 and A3 located on the first side 11b, output ports B1 and B3 located on the second side 12b, and output ports C1 and C3 located on the first side 11b. The second buffer elements 22b and 22c have input ports B2 and B4 located on the second side 12b, input ports C2 and C4 located on the first side 11b, and output ports A2 and A4 located on the first side 11b. A control module 30 can be disposed on a printed circuit board. The first buffer elements 21b and 21c and the second buffer elements 22b and 22c are all connected to the control module 30 such that a control signal of the control module 30 can control the multiplexers and the de-multiplexers.

Figure 4:
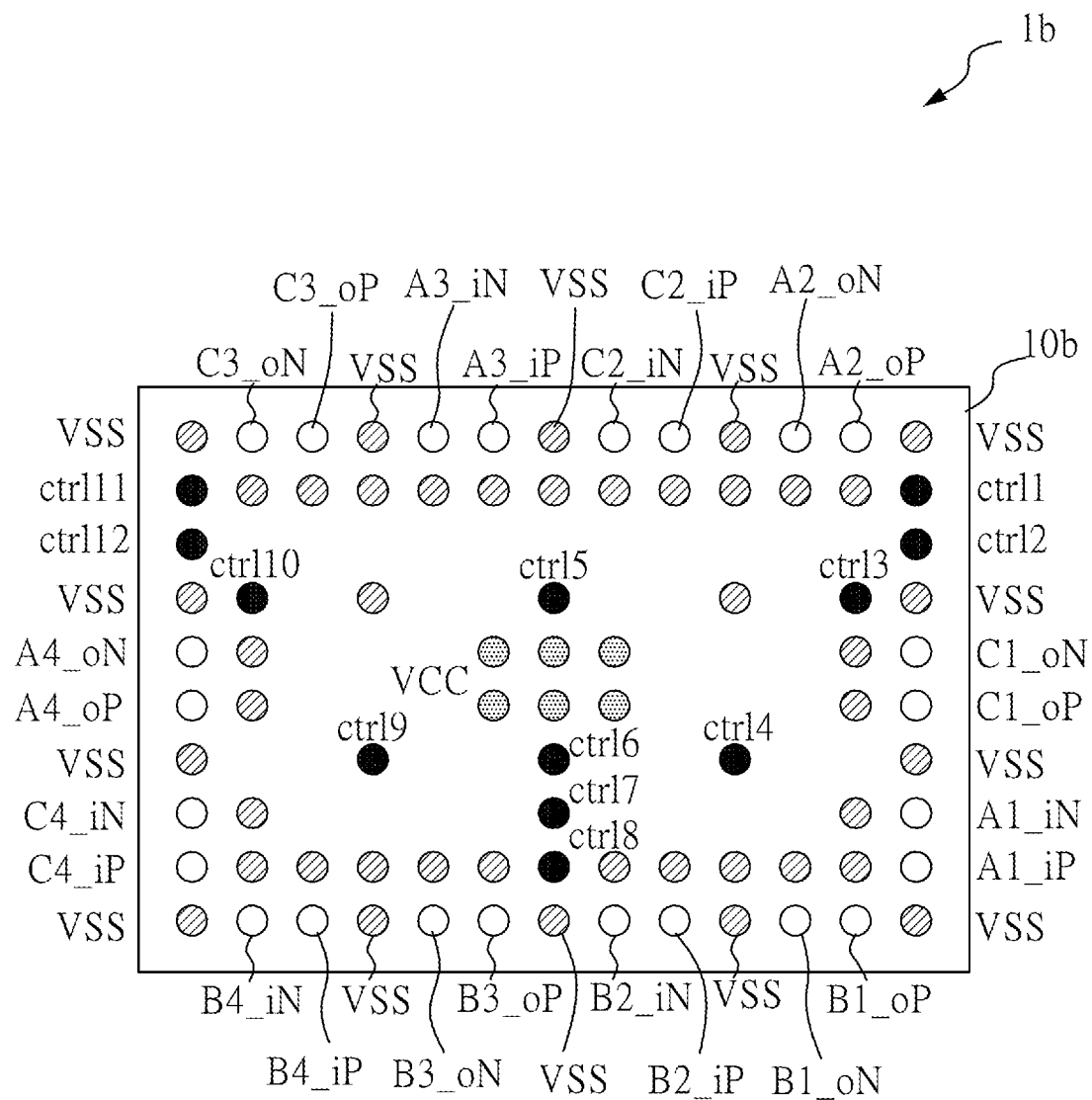
FIG. 4 illustrates a schematic drawing showing a pin configuration of the routing integrated circuit element according to the second embodiment of the present invention.

Now please refer to FIG. 4, which illustrates a schematic drawing showing a pin configuration of the routing integrated circuit element according to the second embodiment of the present invention.

In the second embodiment of the present invention, the body 10b of the routing integrated circuit element 1b in fact comprises a plurality of power pins VCC, a plurality of ground pins VSS, a plurality of control pins ctrl1-ctrl12, a plurality of input pins A1_iP, A1_iN, A3_iP, A3_iN, B2_iP, B2_iN, B4_iP, B4_iN, C2_iP, C2_iN, C4_iP, C4_iN, and a plurality of output pins A2_oP, A2_oN, A4_oP, A4_oN, B1_oP, B1_oN, B3_oP, B3_oN, C1_oP, C1_oN, C3_oP, C3_oN. In the second embodiment of the present invention, differential signal transmission is used as an example for explanation; therefore, each of the abovementioned input ports A1, A3, B2, B4, C2, C4 and output ports A2, A4, B1, B3, C1, C3 has two pins in FIG. 4, respectively.

The plurality of power pins VCC as shown in FIG. 4 are disposed on the center of the body 10b for conveniently receiving power supply signals transmitted from the printed circuit board. The plurality of control pins ctrl1-ctrl12 are pins for low speed transmission, wherein some of the control pins ctrl1, ctrl2, ctrl11, ctrl12 are disposed on the edge of the body 10b for being connected to the control module 30 so as to accordingly transmit the control signal to the first buffer elements 21b, 21c and the second buffer elements 22b, 22c. The plurality of input pins A1_iP, A1_iN, A3_iP, A3_iN, B2_iP, B2_iN, B4_iP, B4_iN, C2_iP, C2_iN, C4_iP, C4_iN and the plurality of output pins A2_oP, A2_oN, A4_oP, A4_oN, B1_oP, B1_oN, B3_oP, B3_oN, C1_oP, C1_oN, C3_oP, C3_oN are pins for high speed transmission and are disposed on the edge of the body 10b in order to match with the layout of the first buffer elements 21b, 21c and the second buffer elements 22b, 22c so as to shorten the signa transmission path. The first buffer elements 21b, 21c and the second buffer elements 22b, 22c are respectively connected to the first electronic module 2a, the second electronic module 2b and the third electronic module 2c (as shown in FIGS. 5A-5B) via the plurality of input pins A1_iP, A1_iN, A3_iP, A3_iN, B2_iP, B2_iN, B4_iP, B4_iN, C2_iP, C2_iN, C4_iP, C4_iN and the plurality of output pins A2_oP, A2_oN, A4_oP, A4_oN, B1_oP, B1_oN, B3_oP, B3_oN, C1_oP, C1_oN, C3_oP, C3_oN. The plurality of ground pins VSS are disposed on the edge of the body 10b and are used for spacing between the plurality of input/output pins and for spacing between the plurality of input/output pins and the plurality of control pins ctrl1-ctrl12 so as to avoid signal interference among pins.

Please refer to FIG. 5A, which illustrates a schematic drawing showing a transmission path of the routing integrated circuit element according to the second embodiment of the present invention.

According to the transmission path as shown in FIG. 5A, when the first electronic module 2a needs to transmit an electronic signal to the second electronic module 2b, by means of the conversion conducted by the control module 30, the electronic signal of the first electronic module 2a will be transmitted to the second electronic module 2b via the input port A1 or A3, the first buffer element 21b or 21c, and the output port B1 or B3. When the second electronic module 2b needs to transmit the electronic signal to the first electronic module 2a, the electronic signal will be transmitted to the first electronic module 2a via the input port B2 or B4, the second buffer element 22b or 22c, and the output port A2 or A4. In this regard, the routing integrated element 1b will comprise two channels from the first electronic module 2a to the second electronic module 2b and two channels from the second electronic module 2b to the first electronic module 2a.

Finally, please refer to FIG. 5B, which illustrates a schematic drawing showing a second transmission path of the routing integrated circuit element according to the second embodiment of the present invention.

According to the transmission path as shown in FIG. 5B, when the first electronic module 2a needs to transmit an electronic signal to the third electronic module 2c, then by means of the conversion conducted by the control module 30, the electronic signal of the first electronic module 2a will be transmitted to the third electronic module 2c via the input port A1 or A3, the first buffer element 21b or 21c, and the output port C1 or C3. When the third electronic module 2c needs to transmit the electronic signal to the first electronic module 2a, the electronic signal will be transmitted to the first electronic module 2a via the input port C2 or C4, the second buffer element 22b or 22c, and the output port A2 or A4. In this regard, the routing integrated element 1b will comprise two channels from the first electronic module 2a to the third electronic module 2c and two channels from the third electronic module 2c to the first electronic module 2a. As a result, the routing integrated circuit element 1b can be configured according to the locations of the first electronic module 2a, the second electronic module 2b and the third electronic module 2c so as to shorten the transmission path of the electronic signal. Therefore, the electronic signal can be smoothly transmitted between the first electronic module 2a, the second electronic module 2b and the third electronic module 2c.

According to the abovementioned description, the routing integrated circuit element 1a, 1b of the present invention can shorten the signal transmission distance, reduce the total signal loss, decrease the number of circuit board vias and reduce the complexity of the circuit layout, thereby avoiding problems such as crosstalk and signal quality degradation.

Although the present invention has been explained in relation to its preferred embodiments, it is to be understood that many other possible modifications and variations can be made without departing from the spirit and scope of the invention as hereinafter claimed.

What is claimed is:

1. A routing integrated circuit element, connected between a first electronic module and a second electronic module so as to transmit an electronic signal, the routing integrated circuit element comprising:
   a body, having a first side and a second side, the first side being connected to the first electronic module, the second side being connected to the second electronic module and located on a different side from the first side, and the distance between the second side and the second electronic module being shorter than the distance between the second side and the first electronic module;
   a first buffer element, disposed in the body, used for transmitting the electronic signal from the first side to the second side; and
   a second buffer element, disposed in the body, used for transmitting the electronic signal from the second side to the first side, wherein a transmission direction of the electronic signal transmitted by the first buffer element and a transmission direction of the electronic signal transmitted by the second buffer element are opposite so that the electronic signal can be smoothly transmitted between the first electronic module and the second electronic module.

2. The routing integrated circuit element as claimed in claim 1, wherein the first buffer element is a de-multiplexer.

3. The routing integrated circuit element as claimed in claim 2, wherein the second buffer element is a multiplexer.

4. The routing integrated circuit element as claimed in claim 3, connected to a third electronic module via the multiplexer and the de-multiplexer, wherein the third electronic module is located closer to the first side.

5. The routing integrated circuit element as claimed in claim 4, further comprising controlling the multiplexer and the de-multiplexer by means of connecting to a control module so as to allow control of the electronic signal being transmitted between the first electronic module and the second electronic module or between the first electronic module and the third electronic module.

6. The routing integrated circuit element as claimed in claim 5, wherein the body further comprises:
   a plurality of power pins, disposed on the center of the body;
   a plurality of input/output pins, disposed on the edge of the body, for being respectively connected to the first electronic module, the second electronic module and the third electronic module;
   a plurality of control pins, disposed on the edge of the body, for being connected to the control module; and a plurality of ground pins, disposed on the edge of the body, used for spacing between the plurality of input/output pins and for spacing between the plurality of input/output pins and the plurality of control pins.

7. The routing integrated circuit element as claimed in claim 6, wherein the second side and the first side are respectively located on opposite sides or adjacent sides of the body.

8. The routing integrated circuit element as claimed in claim 1, wherein the first buffer element or the second buffer element is an amplifier.

9. The routing integrated circuit element as claimed in claim 1, wherein the first buffer element or the second buffer element is an attenuator.

10. The routing integrated circuit element as claimed in claim 9, wherein the second side and the first side are located on opposite sides of the body.

11. The routing integrated circuit element as claimed in claim 8, wherein the second side and the first side are located on opposite sides of the body.

* * * * *